United States Patent
Young et al.

(10) Patent No.: US 12,150,311 B2
(45) Date of Patent: *Nov. 19, 2024

(54) EMBEDDED FERROELECTRIC FINFET MEMORY DEVICE

(71) Applicant: Taiwan Semiconductor Manufacturing Company, Ltd., Hsin-Chu (TW)

(72) Inventors: Bo-Feng Young, Taipei (TW); Chung-Te Lin, Tainan (TW); Sai-Hooi Yeong, Zhubei (TW); Yu-Ming Lin, Hsinchu (TW); Sheng-Chih Lai, Hsinchu County (TW); Chih-Yu Chang, New Taipei (TW); Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/364,616

(22) Filed: Aug. 3, 2023

(65) Prior Publication Data

US 2023/0403860 A1 Dec. 14, 2023

Related U.S. Application Data

(60) Continuation of application No. 17/867,998, filed on Jul. 19, 2022, now Pat. No. 11,832,450, which is a
(Continued)

(51) Int. Cl.
*H10B 51/30* (2023.01)
*G11C 11/22* (2006.01)
*H01L 27/12* (2006.01)

(52) U.S. Cl.
CPC ............ *H10B 51/30* (2023.02); *G11C 11/223* (2013.01); *H01L 27/1211* (2013.01)

(58) Field of Classification Search
CPC ...... H10B 51/30; H10B 51/20; G11C 11/223; H01L 27/1211; H01L 29/785;
(Continued)

(56) References Cited

U.S. PATENT DOCUMENTS 5,684,315 A * 11/1997 Uchiyama ............... H10B 12/31
257/295
5,959,879 A * 9/1999 Koo ........................ G11C 11/22
257/295
(Continued)

FOREIGN PATENT DOCUMENTS

TW 201737470 A 10/2017

OTHER PUBLICATIONS

Non-Final Office Action dated Dec. 24, 2021 for U.S. Appl. No. 16/798,719.
(Continued)

*Primary Examiner* — S M Sohel Imtiaz
(74) *Attorney, Agent, or Firm* — Eschweiler & Potashnik, LLC

(57) ABSTRACT

Various embodiments of the present disclosure are directed towards a method of forming a ferroelectric memory device. In the method, a pair of source/drain regions is formed in a substrate. A gate dielectric and a gate electrode are formed over the substrate and between the pair of source/drain regions. A polarization switching structure is formed directly on a top surface of the gate electrode. By arranging the polarization switching structure directly on the gate electrode, smaller pad size can be realized, and more flexible area ratio tuning can be achieved compared to arranging the polarization switching structure under the gate electrode
(Continued)

with the aligned sidewall and same lateral dimensions. In addition, since the process of forming gate electrode can endure higher annealing temperatures, such that quality of the ferroelectric structure is better controlled.

20 Claims, 14 Drawing Sheets

Related U.S. Application Data division of application No. 16/798,719, filed on Feb. 24, 2020, now Pat. No. 11,508,753.

(58) Field of Classification Search
CPC ........... H01L 29/40111; H01L 27/1159; H01L 29/516; H01L 29/6684; H01L 29/78391; H01L 29/66477; H01L 29/7855
See application file for complete search history.

(56) References Cited

U.S. PATENT DOCUMENTS

| | | | | |
|---|---|---|---|---|
| 6,603,161 | B2* | 8/2003 | Kanaya | H10B 53/00 257/295 |
| 9,985,134 | B1* | 5/2018 | Lin | H01L 21/02167 |
| 10,811,431 | B1* | 10/2020 | Makala | H10B 51/20 |
| 11,508,753 | B2* | 11/2022 | Young | H01L 29/78391 |
| 2001/0022372 | A1* | 9/2001 | Kanaya | H10B 53/00 257/295 |
| 2003/0095448 | A1* | 5/2003 | Ichige | G11C 16/0433 257/E27.103 |
| 2005/0054166 | A1* | 3/2005 | Hsu | H01L 29/66545 257/E21.208 |
| 2005/0151210 | A1* | 7/2005 | Li | H01L 29/78391 257/E21.208 |
| 2012/0211837 | A1* | 8/2012 | Baars | H01L 21/823475 257/E27.06 |
| 2013/0026553 | A1* | 1/2013 | Horch | H01L 29/40114 438/257 |
| 2014/0187037 | A1* | 7/2014 | Rho | H10B 12/0335 438/626 |
| 2018/0374929 | A1* | 12/2018 | Yoo | H01L 29/513 |
| 2019/0013400 | A1* | 1/2019 | Lee | H01L 29/0847 |
| 2019/0019800 | A1* | 1/2019 | Yoo | H01L 29/517 |
| 2019/0027601 | A1* | 1/2019 | Gao | H01L 27/1211 |
| 2019/0130956 | A1* | 5/2019 | Müller | H01L 29/0673 |
| 2019/0131420 | A1* | 5/2019 | Lu | H01L 29/40111 |
| 2019/0207009 | A1* | 7/2019 | Yamaguchi | H01L 29/6684 |
| 2020/0027493 | A1* | 1/2020 | Müller | G11C 16/04 |
| 2020/0105940 | A1* | 4/2020 | Majhi | H01L 29/516 |

OTHER PUBLICATIONS

Notice of Allowance dated Jun. 23, 2022 for U.S. Appl. No. 16/798,719.
Non-Final Office Action dated Apr. 18, 2023 for U.S. Appl. No. 17/867,998.
Notice of Allowance dated Jul. 27, 2023 for U.S. Appl. No. 17/867,998.

* cited by examiner

EMBEDDED FERROELECTRIC FINFET MEMORY DEVICE

REFERENCE TO RELATED APPLICATIONS

This Application is a Continuation of U.S. application Ser. No. 17/867,998, filed on Jul. 19, 2022, which is a Divisional of U.S. application Ser. No. 16/798,719, filed on Feb. 24, 2020 (now U.S. Pat. No. 11,508,753, issued on Nov. 22, 2022). The contents of the above-referenced Patent Applications are hereby incorporated by reference in their entirety.

BACKGROUND

Many modern day electronic devices include non-volatile memory. Non-volatile memory is electronic memory that is able to store data in the absence of power. A promising candidate for the next generation of non-volatile memory is ferroelectric field effect transistor (FeFET), which is also called as negative capacitance field effect transistor (NCFET), in some instances. FeFET has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
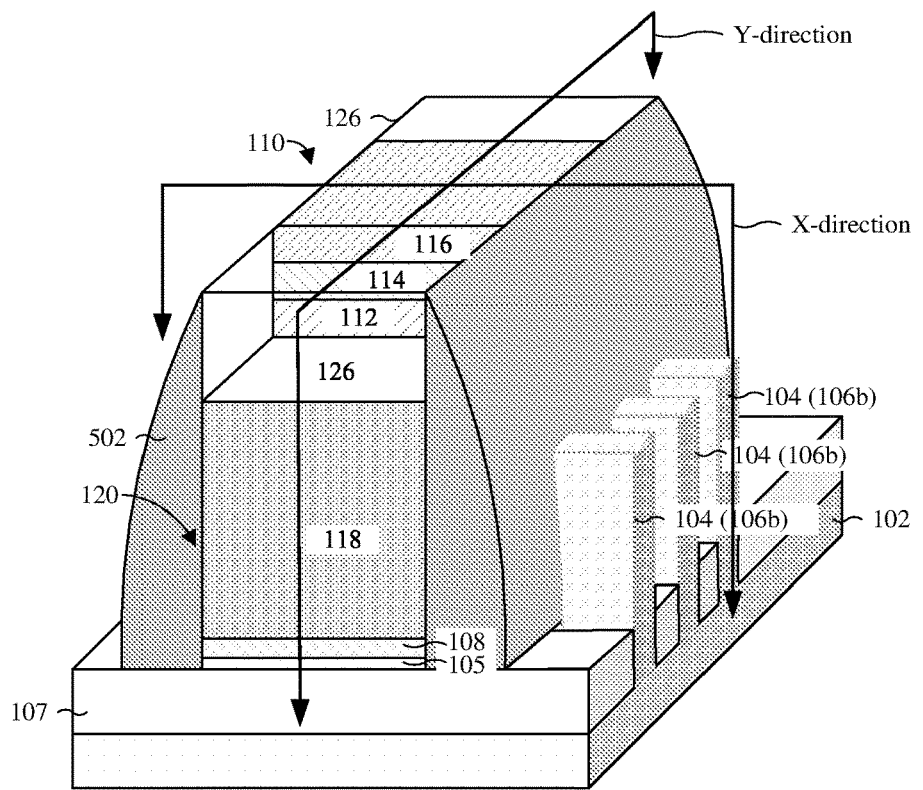
FIG. 1 illustrates a schematic view of some embodiments of a ferroelectric FinFET memory device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some ferroelectric memory (e.g., ferroelectric field effect transistor (FeFET)) comprises a ferroelectric memory cell. The ferroelectric memory cell comprises a ferroelectric structure disposed between a first electrode and a second electrode. The ferroelectric structure may be integrated in a back-end-of-line (BEOL) structure between metal lines or be integrated in a gate structure between a gate electrode and a substrate. The ferroelectric structure is configured to switch between polarization states to store data (e.g., binary "0" and "1"). The ferroelectric memory is often disposed on an integrated chip (IC) comprising other types of semiconductor devices (e.g., metal-oxide semiconductor field-effect transistors (MOSFETs), bipolar junction transistors (BJTs), high-electron-mobility transistors (HEMTs), etc.).

A challenge with the above ferroelectric memory is manufacturing condition and size limitations. The manufacturing process of the ferroelectric structure integrated in BEOL is constrained by anneal temperature and critical dimensions. The dimension of the ferroelectric structure formed under the gate electrode is constrained to be equal to the gate electrode area. The area of the ferroelectric structure is very important to the property of the ferroelectric memory device. As an example, a ratio of the ferroelectric structure area to the gate electrode area may be in a range of from about 1:5 to about 1:10.

In view of the above, the present disclosure relates to a ferroelectric memory device with a more flexible polarization switching structure. In some embodiments, the polarization switching structure is arranged on a gate electrode of the memory device. The gate electrode may be recessed from top of a sidewall spacer such that the polarization switching structure can be formed within an upper portion of a gate opening surrounded by the sidewall spacer. In some embodiments, a self-aligned contact (SAC) mask is arranged on the gate electrode to provide a contact landing much closer to the gate electrode and even on top of the gate electrode. The polarization switching structure may be disposed through the SAC mask. By arranging the polarization switching structure on the gate electrode or incorporated in the SAC mask, smaller pad size can be realized compared to the polarization switching structure in the BEOL structure.

Also, more flexible area ratio tuning can be achieved compared to arranging the polarization switching structure under the gate electrode with the aligned sidewall and same lateral dimensions. In addition, since the middle-end-of-line (MEOL) process, or the process of forming gate electrode or the SAC mask, can endure higher annealing temperatures, such that quality of the ferroelectric structure is better controlled.

FIG. 1 illustrates a schematic view of some embodiments of a ferroelectric FinFET memory device 100. The ferroelectric FinFET memory device 100 may be referred to as a ferroelectric field-effect transistor (FeFET). As shown in FIG. 1, a substrate 102 may comprise an upper portion including a plurality of fin structures 104 rising from a planar lower portion. The substrate 102 may comprise any type of semiconductor body (e.g., monocrystalline silicon/CMOS bulk, silicon-germanium (SiGe), silicon on insulator (SOI), etc.). An isolation dielectric layer 107 may be disposed on the planar lower portion of the substrate 102 providing isolation function for the substrate 102. The isolation dielectric layer 107 may comprise silicon dioxide or other applicable dielectric materials.

The fin structures 104 respectively comprises a pair of source/drain regions (see FIG. 2, 106a/106b) on opposite sides of a memory device gate stack 120. The source/drain regions are doped regions that have a doping type (e.g., n-type or p-type) opposite that of adjoining regions of the substrate 102, or the adjoining regions of the substrate 102 may be intrinsic. The memory device gate stack 120 straddles on the plurality of fin structures separating the pair of source/drain regions. In some embodiments, the memory device gate stack 120 may comprise an interfacial dielectric layer 105, a gate dielectric 108, and a gate electrode 118 disposed in sequence wrapping a first sidewall, a top surface, and a second sidewall of respective fin structures 104. The gate electrode 118 may have a planar top surface. In some embodiments, a first self-aligned contact (SAC) mask 126 is disposed on the gate electrode 118. A pair of sidewall spacers is disposed on the isolation dielectric layer 107 and along sidewalls of the memory device gate stack 120 and the first SAC mask 126.

In some embodiments, a polarization switching structure 110 may be disposed through the first SAC mask 126 reaching on the gate electrode 118. The polarization switching structure 110 may have a top surface coplanar with that of the first SAC mask 126. In some embodiments, the polarization switching structure 110 comprises a ferroelectric structure 114 disposed between a first conductive structure 112 and a second conductive structure 116. In some embodiments, the first conductive structure 112 may comprise, for example, a metal (e.g., aluminum (Al), titanium (Ti), tantalum (Ta), gold (Au), platinum (Pt), tungsten (W), nickel (Ni), iridium (Ir), etc.), a metal-nitride (e.g., titanium nitride (TiN), tantalum nitride (TaN), etc.), a metal-oxide (e.g., iridium oxide ($IrO_2$)), doped polysilicon (e.g., n-type/p-type polysilicon), or the like. In further embodiments, the ferroelectric structure 114 may comprise one or more layers of, for example, a metal-oxide (e.g., hafnium oxide ($Hf_xO_y$)), a component-metal-oxide (e.g., hafnium-silicon-oxide ($Hf_xSi_yO_z$), hafnium-aluminum-oxide ($Hf_xAl_yO_z$), hafnium-gadolinium-oxide ($Hf_xGd_yO_z$), hafnium-zirconium-oxide ($Hf_xZr_yO_z$), hafnium-lanthanum-oxide ($Hf_xLa_yO_z$), hafnium-strontium-oxide ($Hf_xSr_yO_z$), hafnium-yttrium-oxide ($Hf_xY_yO_z$), strontium titanate (STO), etc.), a metal-oxynitride (e.g., hafnium oxynitride ($Hf_xO_yN_z$)), or the like. In yet further embodiments, the second conductive structure 116 may comprise, for example, a metal (e.g., Al, Ti, Ta, Au, Pt, W, Ni, Ir, etc.), a metal-nitride (e.g., TiN, TaN, etc.), a metal-oxide (e.g., $IrO_2$), doped polysilicon (e.g., n-type/p-type polysilicon), or the like.

The polarization switching structure 110 is configured to store a bit of data. For example, the polarization switching structure 110 may switch between a first polarization state (e.g., negative remnant (−Pr) polarization state), which corresponds to a binary value of "1," and a second polarization state (e.g., positive remnant (+Pr) polarization state), which corresponds to a binary value of "0," or vice versa. In some embodiments, a positive voltage pulse is applied to the gate electrode 118 to switch to the first polarization state, and a negative voltage pulse is applied to the gate electrode 118 to switch to the second polarization state, or vice versa.

Figure 2:
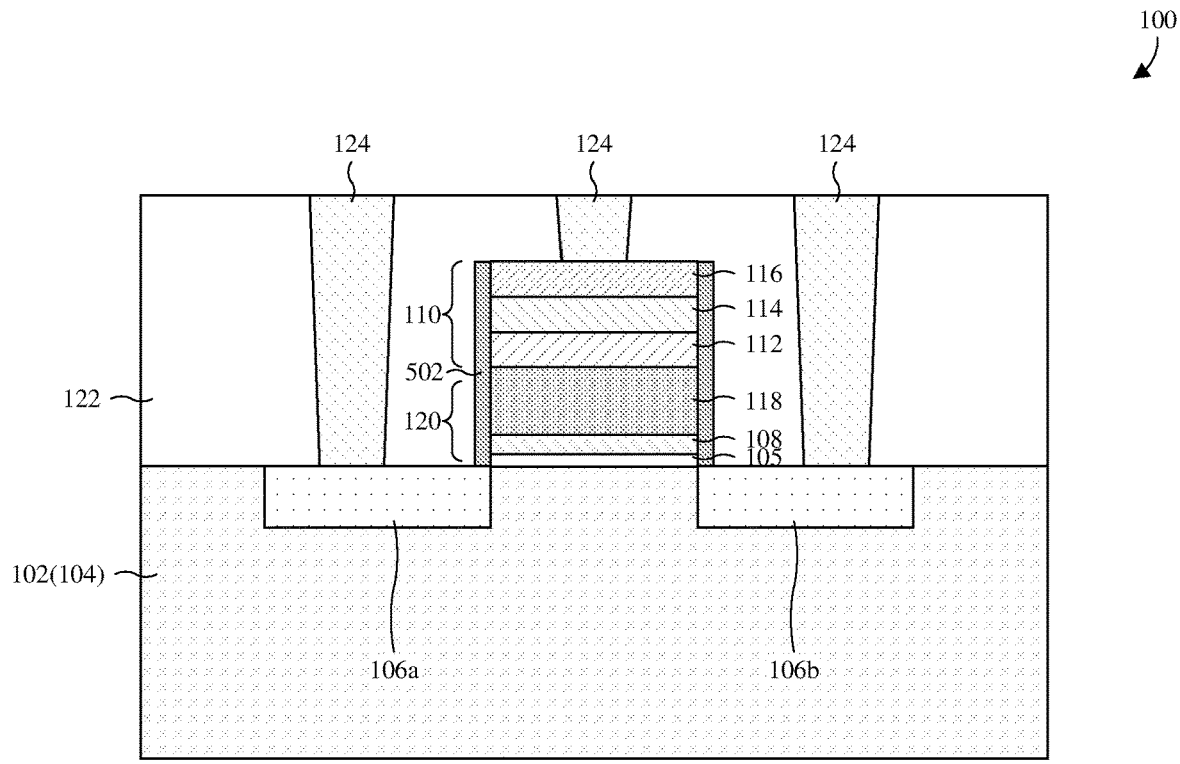
FIG. 2 illustrates a cross-sectional view of some embodiments of the ferroelectric FinFET memory device of FIG. 1 along X-direction.

FIG. 2 illustrates a cross-sectional view of some embodiments of a ferroelectric FinFET memory device. In some embodiments, FIG. 2 may be a cross-sectional view of some embodiments of the ferroelectric FinFET memory device 100 of FIG. 1 along X-direction. Similar as discussed above, a pair of source/drain regions 106a-b are disposed in the substrate 102 and spaced apart. The pair of source/drain regions 106a-b may be respectively disposed within a plurality of fin structures 104 as an upper portion of the substrate 102. A memory device gate stack 120 is disposed over the substrate 102 and between the source/drain regions 106a-b. The memory device gate stack 120 may comprise an interfacial dielectric layer 105, a gate dielectric 108, and a gate electrode 118 disposed on the substrate 102. A polarization switching structure 110 is disposed on the gate electrode 118. In some embodiments, the polarization switching structure 110 comprises a ferroelectric structure 114 disposed between a first conductive structure 112 and a second conductive structure 116. A pair of sidewall spacers 502 is disposed on opposite sides of the memory device gate stack 120 and the polarization switching structure 110.

An interlayer dielectric (ILD) structure 122 is disposed over the substrate 102 and the polarization switching structure 110. The ILD structure 122 may comprise one or more stacked ILD layers, which may respectively comprise a low-k dielectric (e.g., a dielectric material with a dielectric constant less than about 3.9), an oxide (e.g., $SiO_2$), or the like. A plurality of conductive contacts 124 are disposed in the ILD structure 122. The conductive contacts 124 extend through the ILD structure 122 to contact the source/drain regions 106a-b and the polarization switching structure 110, respectively.

Figure 3:
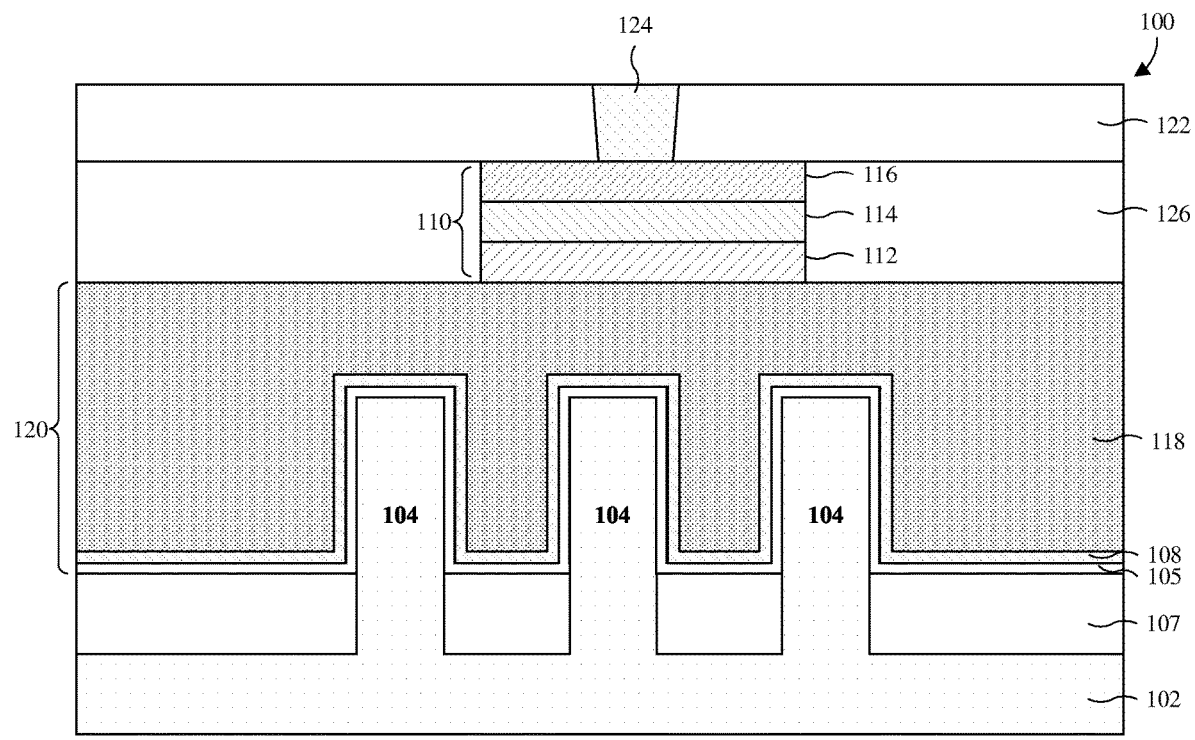
FIG. 3 illustrates a cross-sectional view of some embodiments of the ferroelectric FinFET memory device of FIG. 1 along Y-direction.

FIG. 3 illustrates a cross-sectional view of some embodiments of a ferroelectric FinFET memory device. In some embodiments, FIG. 3 may be a cross-sectional view of some embodiments of the ferroelectric FinFET memory device 100 of FIG. 1 along Y-direction. As shown in FIG. 3, a substrate 102 may have an upper portion including a plurality of fin structures 104 rising from a lower planar portion. An isolation dielectric layer 107 may be disposed on the planar lower portion of the substrate 102 and filling spaces of the plurality of fin structures 104. The isolation dielectric layer 107 may have a top surface lower than that of the plurality of fin structures 104. The isolation dielectric layer 107 may comprise silicon dioxide or other applicable dielectric materials. A memory device gate stack 120 is disposed on the isolation dielectric layer 107 and straddles on the plurality of fin structures 104. The memory device gate stack 120 may comprise an interfacial dielectric layer 105 contacting the plurality of fin structures 104, a gate dielectric 108 disposed on the interfacial dielectric layer 105, and a gate electrode 118 disposed on the gate dielectric 108. The gate electrode 118 may have a planar top surface. A polarization switching structure 110 is disposed on the gate electrode 118. In some embodiments, the polarization switching structure 110 comprises a ferroelectric structure 114 disposed between a first conductive structure 112 and a second conductive structure 116. In some embodiments, a first self-aligned contact (SAC) mask 126 is disposed on the gate electrode 118. And the polarization switching structure 110 may be disposed through the first SAC mask 126 reaching on the gate electrode 118. The polarization switching structure 110 may have a top surface coplanar with that of the first SAC mask 126. An interlayer dielectric (ILD) structure 122 is disposed over the polarization switching structure 110 and the first SAC mask 126. A conductive contact 124 extends through the ILD structure 122 to contact the polarization switching structure 110.

Figures 4, 5:
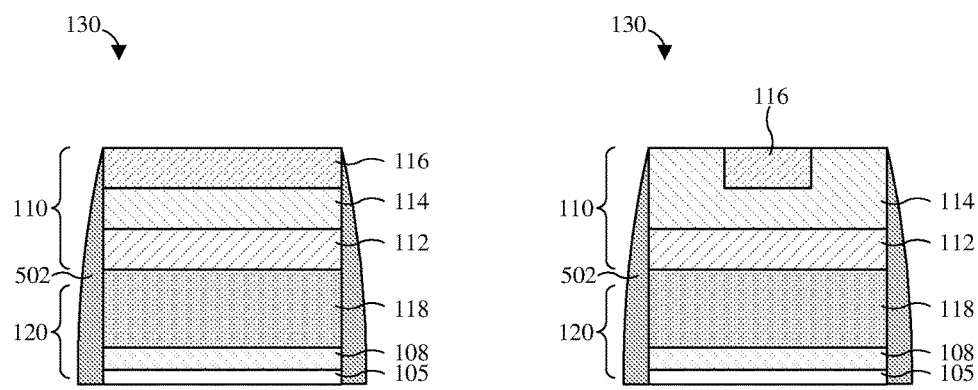
FIGS. 4-10 illustrate cross-sectional views of some embodiments of a FeFET stack.
Figure 6:
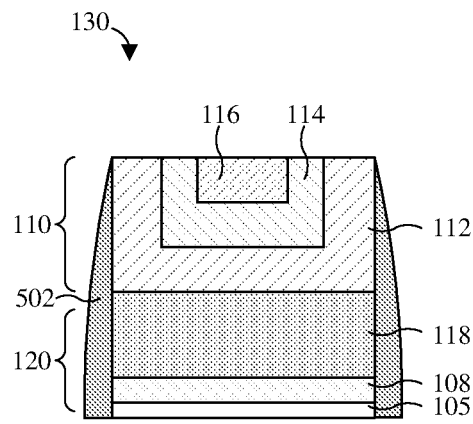
Figure 7:
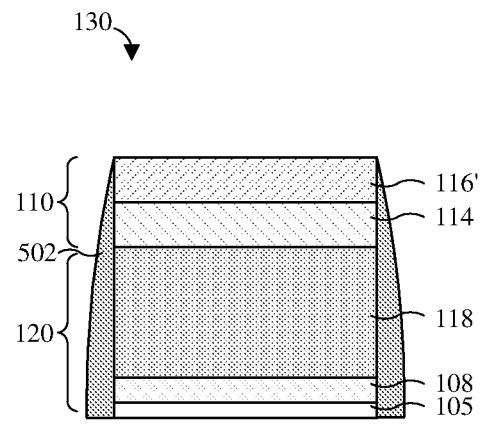
Figure 8:
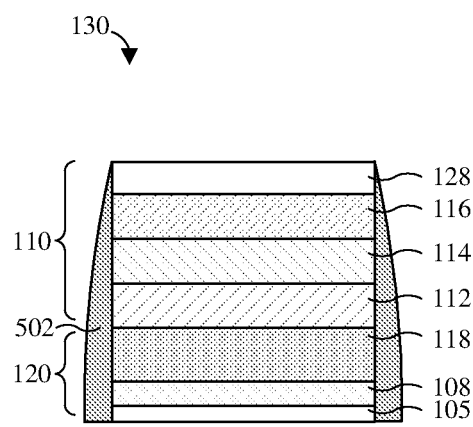
Figure 9:
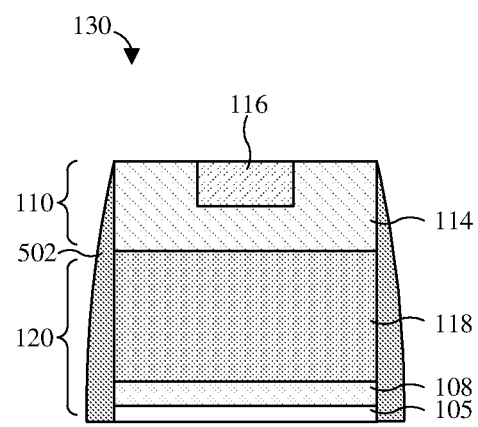
Figure 10:
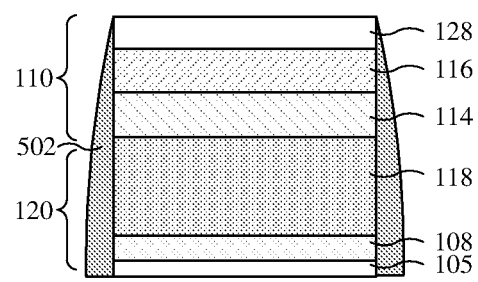

FIGS. 4-10 illustrate cross-sectional views of some embodiments of a FeFET stack 130. As shown in FIG. 4, the FeFET stack 13 may comprise a first conductive structure 112 disposed on a memory device gate stack 120, a ferroelectric structure 114 disposed on the first conductive structure 112, and a second conductive structure 116 disposed on the ferroelectric structure 114. In some embodiments, sidewalls of the memory device gate stack 120, sidewalls of the first conductive structure 112, sidewalls of the ferroelectric structure 114, and sidewalls of the second conductive structure 116 may be substantially aligned in a vertical direction. In such embodiments, a lateral area (e.g. length (across the page of FIG. 4) times width (into/out of the page of FIG. 4)) of the memory device gate stack 120, an area of the first conductive structure 112, an area of the ferroelectric structure 114, an area of the second conductive structure 116 may be substantially the same. As shown in FIG. 5, in other embodiments, the ferroelectric structure 114 may have a U-shape, and the sidewalls of the second conductive structure 116 may be disposed between the sidewalls of the ferroelectric structure 114. In such embodiments, the ferroelectric structure 114 may have a top surface coplanar with that of the second conductive structure 116. As shown in FIG. 6, in other additional embodiments, the first conductive structure 112 may have a U-shape, the sidewalls of the ferroelectric structure 114 may be disposed between the sidewalls of the first conductive structure 112, and the sidewalls of the second conductive structure 116 may be disposed between the sidewalls of the ferroelectric structure 114. In such embodiments, the first conductive structure 112 and the ferroelectric structure 114 may have top surfaces coplanar with that of the second conductive structure 116. As shown in FIG. 7, the polarization switching structure 110 may comprise a ferroelectric structure 114 disposed on a memory device gate stack 120 and a conductive structure 116' disposed on the ferroelectric structure 114. The ferroelectric structure 114 may be in direct contact with the device gate stack. A conductive structure between the memory device gate stack 120 and the ferroelectric structure 114 (similar to the first conductive structure 112 in FIG. 4) may be omitted. The gate electrode 118 acts as a lower electrode for the polarization switching structure 110. As shown in FIG. 8 or FIG. 10, a second SAC mask 128 may be disposed on top of the polarization switching structure 110, such that source/drain contacting flexibility can be enhanced. The second SAC mask 128 may have a top surface co-planar with that of the sidewall spacers 502. In some embodiments, the top surface of the second SAC mask 128 may also be coplanar with that of a first SAC mask 126 and/or an ILD structure 122.

Figure 11:
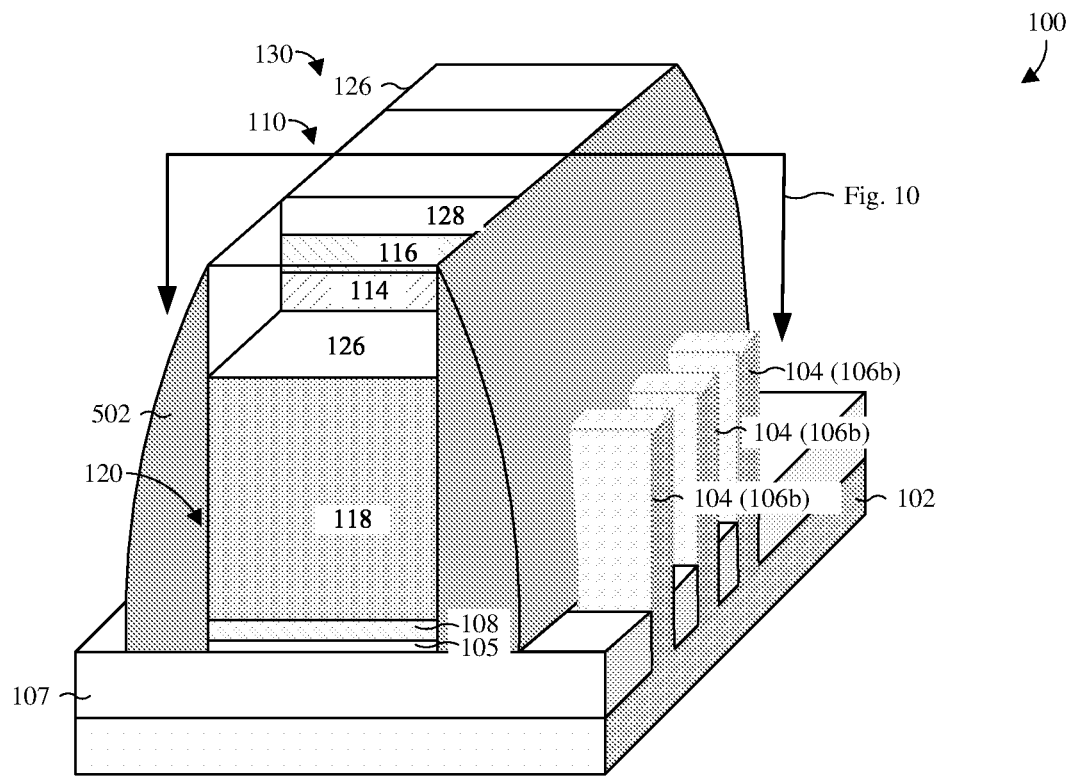
FIG. 11 illustrates a schematic view of some embodiments of a ferroelectric FinFET memory device.

FIG. 11 shows a schematic view of some embodiments of a ferroelectric FinFET memory device 100 that may present a FeFET stack 130 shown in FIG. 10. As shown in FIG. 9, in other additional embodiments, the polarization switching structure 110 may comprise a ferroelectric structure 114 disposed on a memory device gate stack 120 and a conductive structure 116' disposed on the ferroelectric structure 114. The ferroelectric structure 114 may be in direct contact with the device gate stack. The ferroelectric structure 114 may have a U-shape. The sidewalls of the second conductive structure 116 may be disposed between the sidewalls of the ferroelectric structure 114. The ferroelectric structure 114 may have a top surface coplanar with that of the second conductive structure 116. For the embodiments shown in FIGS. 5, 6, or FIG. 9, a ferroelectric effective area may be reduced compared to the embodiments shown in FIG. 4, 7, 8, or FIG. 10. A ratio of the ferroelectric effective area to the MOS area (defined as lateral dimensions of the gate electrode 118) can be flexibly designed by changing the occupation area of the polarization switching structure 110 within the first SAC mask 126 (see FIG. 11).

Figure 12A:
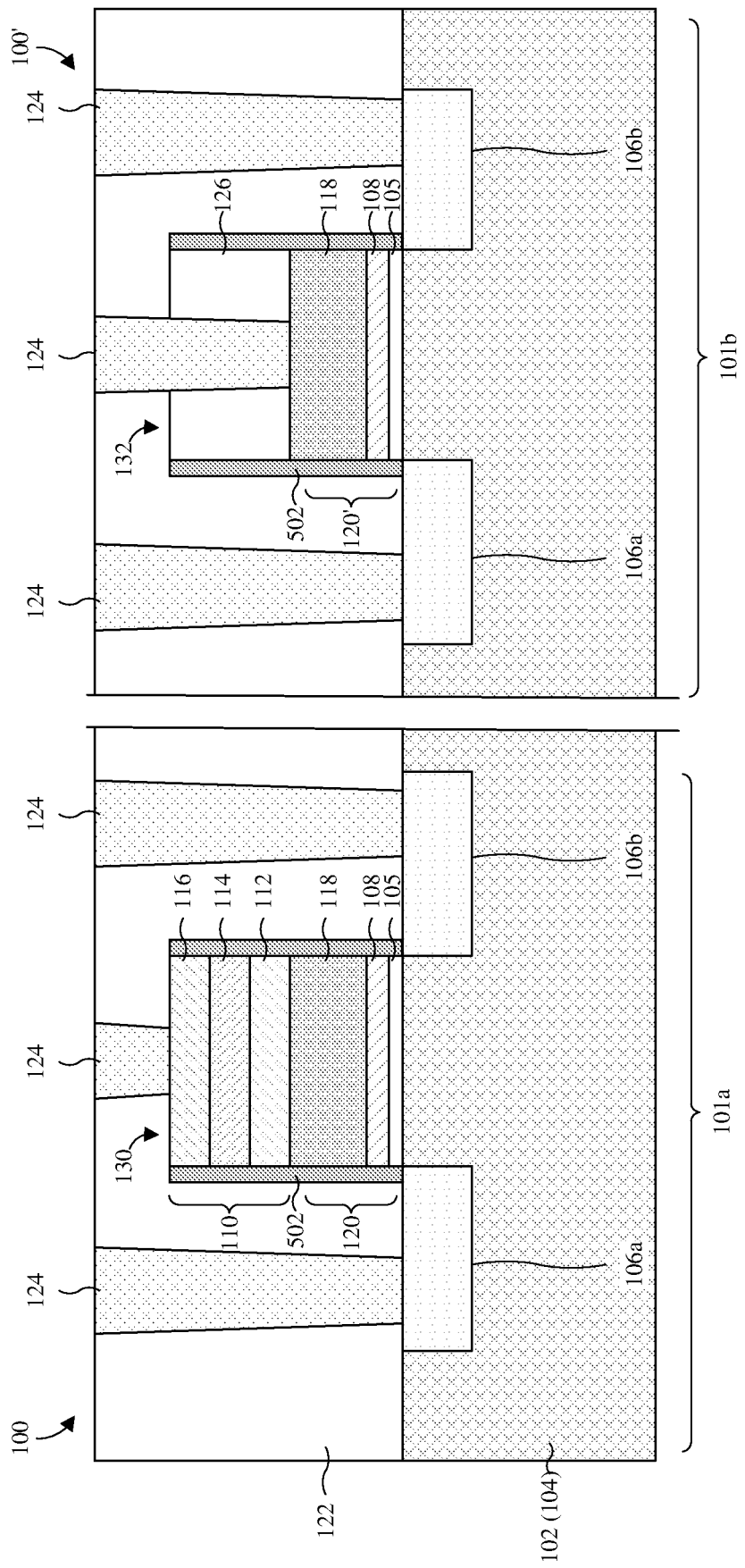
FIG. 12A illustrates a cross-sectional view of some embodiments of an integrated circuit comprising a logic device and a ferroelectric FinFET memory device along X-direction.
Figure 12B:
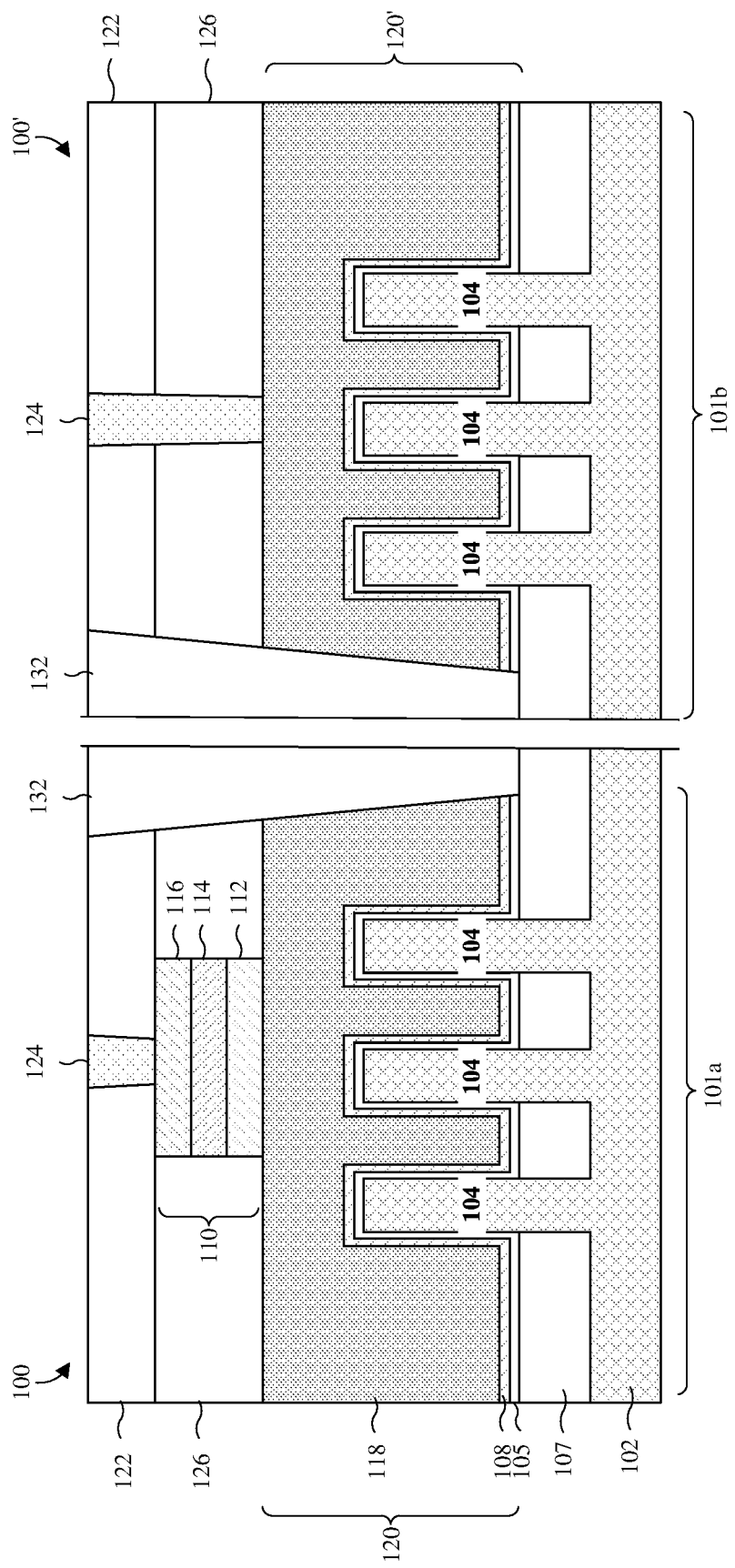
FIG. 12B illustrates a cross-sectional view of some embodiments of an integrated circuit comprising a logic device and a ferroelectric FinFET memory device along Y-direction.

FIG. 12A illustrates a cross-sectional view along X-direction of some embodiments of an integrated circuit comprising a ferroelectric FinFET memory device 100 disposed in a memory region 101a and a logic device 100' disposed in a logic region 101b. FIG. 12B illustrates a cross-sectional view along Y-direction of some embodiments of an integrated circuit comprising a ferroelectric FinFET memory device 100 disposed in a memory region 101a and a logic device 100' disposed in a logic region 101b. The component numerals in FIG. 12A and FIG. 12B are in line with the descriptions of those same component numerals for FIG. 1, FIG. 2, or FIG. 3 and thus can be fully incorporated here. As shown in FIG. 12A and FIG. 12B, the logic device 100' comprises a logic device gate stack 120' disposed over the substrate 102. The ferroelectric FinFET memory device 100 comprises a memory device gate stack 120 disposed over the substrate 102. In some embodiments, the logic device gate stack 120' and the memory device gate stack 120 have the same compositions, for example, the interfacial dielectric layer 105, the gate dielectric 108, and the gate electrode 118, disposed in that order from bottom to top. In some alternative embodiments, the logic device gate stack 120' and the memory device gate stack 120 may have different compositions. The first self-aligned contact (SAC) mask 126 is disposed both on the logic device gate stack 120' and the memory device gate stack 120. In some embodiments, the polarization switching structure 110 is arranged on the memory device gate stack 120 within the first SAC mask 126. The sidewall spacer 502 is disposed along sidewalls of the memory device gate stack 120, the polarization switching structure 110, and the first SAC mask 126. A conductive contact 124 respectively reaches on the polarization switching structure 110 for the ferroelectric FinFET memory device 100 and on the gate electrode 118 for the logic device 100'. A metal gate cutting dielectric 132 may separate the gate electrode 118 of the ferroelectric FinFET memory device 100 and the logic device 100'. The metal gate cutting dielectric 132 may comprise silicon dioxide or other dielectric materials.

Figure 12C:
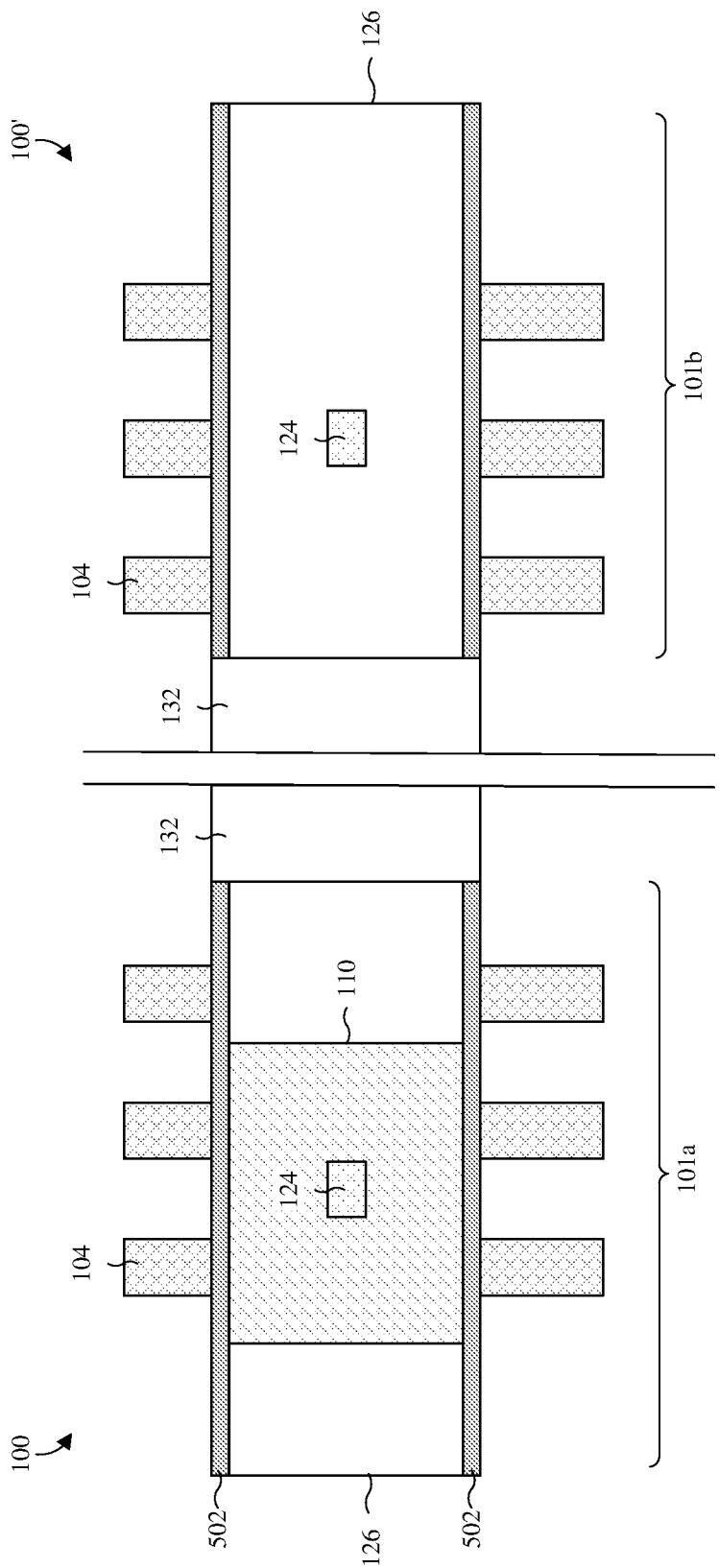
FIG. 12C illustrates a top view of some embodiments of an integrated circuit comprising a logic device and a ferroelectric FinFET memory device.
Figure 12D:
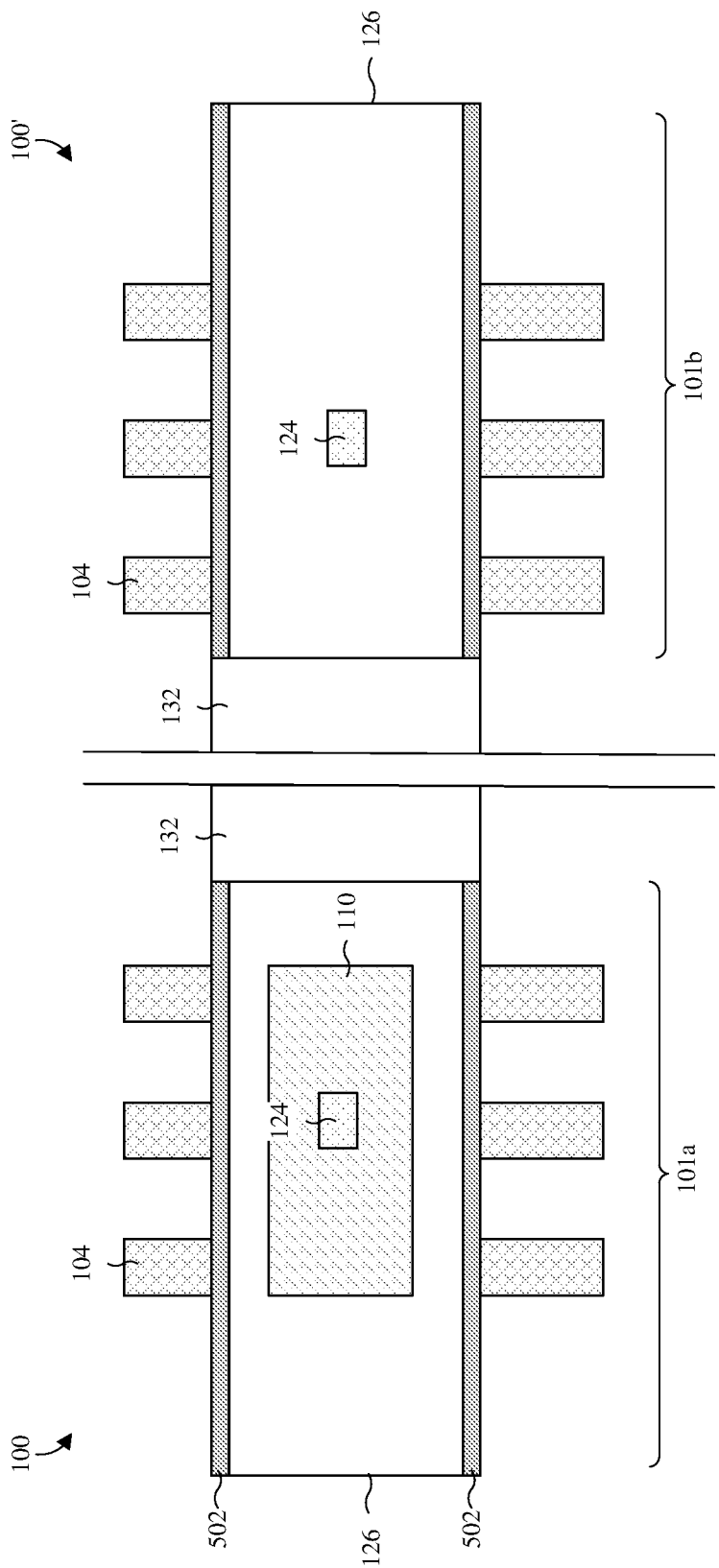
FIG. 12D illustrates a top view of some additional embodiments of an integrated circuit comprising a logic device and a ferroelectric FinFET memory device.

FIG. 12C and FIG. 12D respectively illustrates a top view of some embodiments of an integrated circuit comprising a ferroelectric FinFET memory device 100 disposed in a memory region 101a and a logic device 100' disposed in a logic region 101b. The component numerals in FIG. 12A and FIG. 12B are in line with the descriptions of those same component numerals for FIG. 12A and FIG. 12B and thus can be fully incorporated here. The polarization switching structure 110 is arranged on the memory device gate stack 120 within the first SAC mask 126 and may have a predetermined dimension based on a desired ratio of a ferroelectric effective area to a MOS area (defined as lateral dimensions of the gate electrode 118 referring to FIG. 12B). In some embodiments, the polarization switching structure 110 may have its length substantially equal to a gate length of the gate electrode 118 or the first SAC mask 126 as shown by FIG. 12A and FIG. 12C. In some alternative embodiments, the polarization switching structure 110 may not reach or be aligned with an edge of the fin structures 104 or the gate electrode 118 or the first SAC mask 126. FIG. 12D shows such an example. It is appreciated that other shapes or positions of the polarization switching structure 110 can be adopted. For example, the polarization switching structure 110 can also have a top surface of circle, oval, polygon or other shapes; and can be located in center or a corner of the underlying memory device gate stack 120 (memory device gate stack 120 showed in FIG. 11, FIG. 12A or FIG. 12B).

FIGS. 13-21 illustrate a series of cross-sectional views of some embodiments for forming the ferroelectric FinFET memory device 100.

Figure 13:
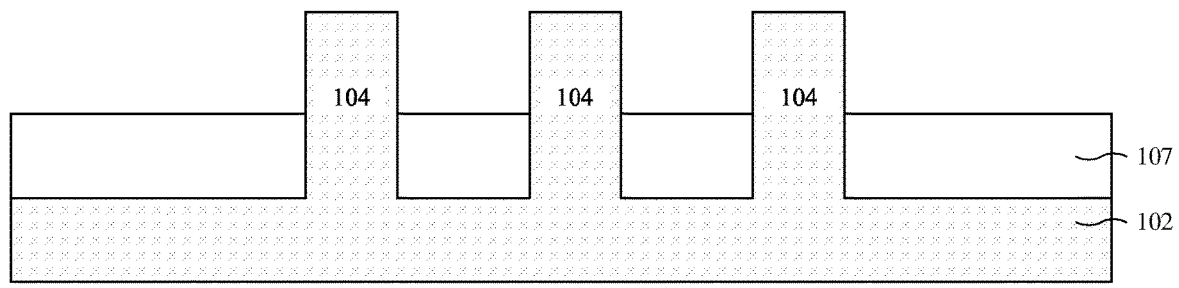
FIGS. 13-21 illustrate a series of cross-sectional views of some embodiments for forming a ferroelectric FinFET memory device.

As shown in FIG. 13, a substrate 102 is prepared. In some embodiments, a plurality of fin structures 104 is formed from an upper portion of the substrate 102. An isolation dielectric layer 107 may be formed on a lower planar portion of the substrate 102 and between the plurality of fin structures 104. For the purpose of illustration, FIG. 13 is a cross-sectional view taken from Y direction. Subsequent FIGS. 14-20 are cross-sectional views taken from X direction and the lower portion of the substrate 102 is omitted. The substrate 102 may comprise any type of semiconductor body (e.g., monocrystalline silicon/CMOS bulk, silicon-germanium (SiGe), silicon on insulator (SOI), etc.). The isolation dielectric layer 107 may comprise an oxide (e.g., $SiO_2$), a nitride, a carbide, or the like.

Figure 14:
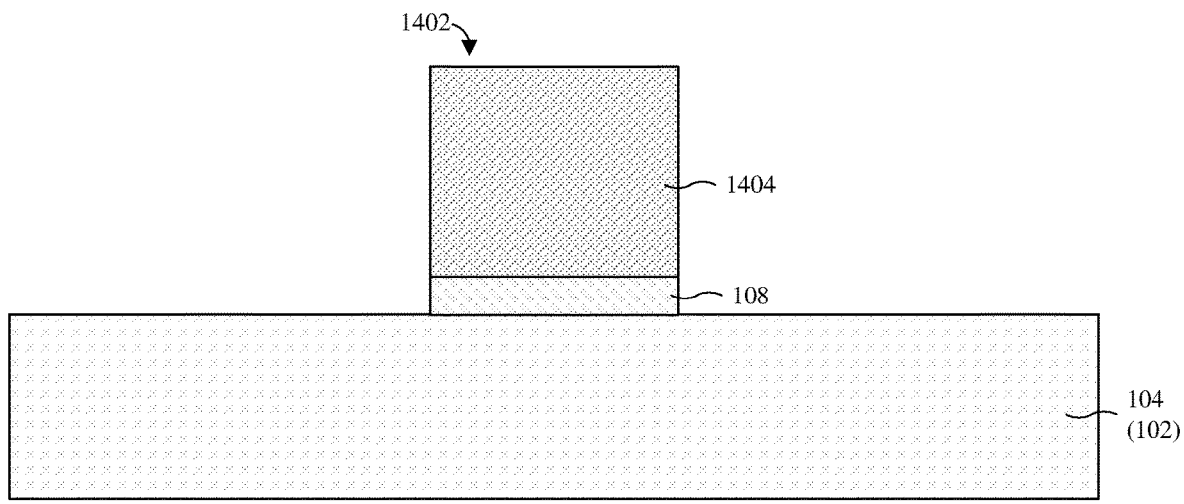

As shown in FIG. 14, a gate dielectric 108 and a sacrificial gate 1404 are formed and patterned on the substrate 102. In some embodiments, the gate dielectric 108 and the sacrificial gate 1404 are formed by depositing a dielectric layer and a processing layer followed by a patterning process. In some embodiments, the dielectric layer, i.e., the later formed gate dielectric 108, may comprise, for example, an oxide (e.g., $SiO_2$), a high-k dielectric material (e.g., HfO2, ZrO2, or some other dielectric material with a dielectric constant greater than about 3.9), some other dielectric material, or a combination of the foregoing. In yet further embodiments, the dielectric layer may be deposited or grown by thermal oxidation, chemical vapor deposition (CVD), physical vapor deposition (PVD), atomic layer deposition (ALD), sputtering, or some other deposition or growth process. In some embodiments, the processing layer, i.e., the later formed sacrificial gate 1404, may comprise, for example, polysilicon. The processing layer may be deposited or grown by CVD, PVD, ALD, epitaxy, sputtering, or some other deposition or growth process. The dielectric layer and the processing layer are patterned into an initial gate stack 1402. In some embodiments, a process for forming the initial gate stack 1402 comprises forming a masking layer over/on the processing layer and patterning the processing layer and the dielectric layer according to the masking layer by an etch (e.g., wet/dry etch). The etch removes unmasked portions of the processing layer and the dielectric layer, thereby forming the sacrificial gate 1404 and the gate dielectric 108, respectively. Subsequently, the masking layer may be stripped away.

Figure 15:
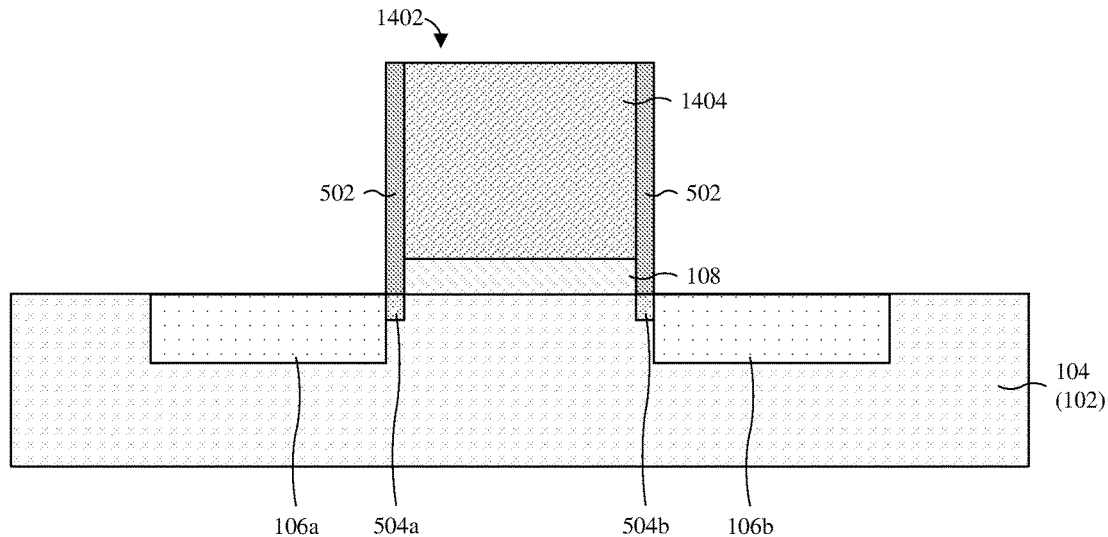

As shown in FIG. 15, a pair of lightly-doped source/drain extensions (LDDs) 504a-b are formed in the substrate 102. The LDDs 504a-b are formed on opposite sides of the initial gate stack 1402. In some embodiments, the LDDs 504a-b are formed by an ion implantation process and may utilize a masking layer (not shown) to selectively implant ions in the substrate 102. In further embodiments, the initial gate stack 1402 may be utilized as the masking layer to form the LDDs 504a-b. A sidewall spacer 502 may be then formed over the substrate 102 and along sides of the initial gate stack 1402. In some embodiments, the sidewall spacer 502 may be formed by depositing a spacer layer (not shown) over the substrate 102 and the initial gate stack 1402. In further embodiments, the spacer layer may comprise a nitride (e.g., SiN), an oxy-nitride (e.g., $SiO_xN_y$), or the like. The spacer layer may be deposited by PVD, CVD, ALD, sputtering, or some other deposition process. Subsequently, the spacer layer is etched to remove the spacer layer from horizontal surfaces, leaving the spacer layer along sides of the initial gate stack 1402 as the sidewall spacer 502. In yet further embodiments, the sidewall spacer 502 may be formed prior to forming the LDDs 504a-b. In such embodiments, the LDDs 504a-b may be formed using an angled ion implantation process.

Also illustrated by FIG. 15, a pair of source/drain regions 106a-b are formed in the substrate 102. The source/drain regions 106a-b are formed on opposite sides of the sidewall spacer 502. In some embodiments, the source/drain regions 106a-b are formed by an ion implantation process and may utilize a masking layer (not shown) to selectively implant ions into the substrate 102. In further embodiments, the initial gate stack 1402 and the sidewall spacer 502 may be utilized as the masking layer to form the source/drain regions 106a-b.

Figure 16:
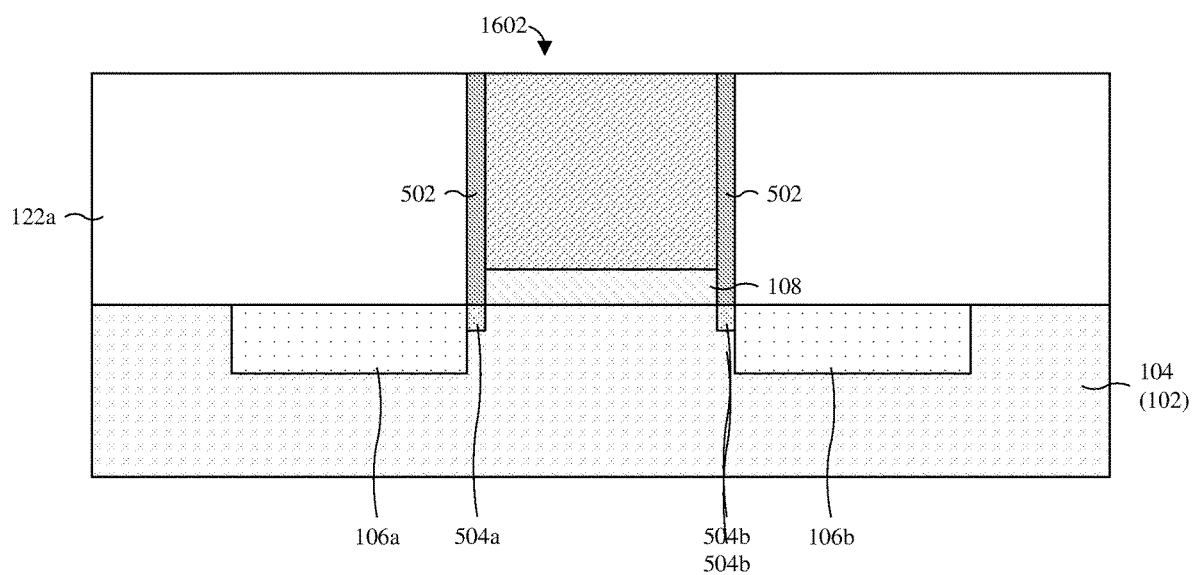

As shown in FIG. 16, a first interlayer dielectric (ILD) structure 122a is formed over the substrate 102. The first ILD structure 122a may be formed with a substantially planar upper surface that is co-planar with an upper surface of the sidewall spacer 502. In some embodiments, a process for forming the first ILD structure 122a comprises depositing an ILD layer on the substrate 102, the interfacial dielectric layer 105, the sidewall spacer 502, and the sacrificial gate 1404 (see, e.g., FIG. 16). The ILD layer may be deposited by CVD, PVD, sputtering, or some other deposition process. Thereafter, a planarization process (e.g., a chemical-mechanical planarization (CMP)) may be performed on the ILD layer to form the first ILD structure 122a.

Also shown in FIG. 16, the sacrificial gate 1404 (see, e.g., FIG. 15) is removed, thereby forming an opening 1602 that is defined by inner sidewalls of the sidewall spacer 502 and an upper surface of the gate dielectric 108. In some embodiments, a process for removing the sacrificial gate 1404 comprises performing an etch (e.g., dry or wet etch) to selectively remove the sacrificial gate 1404. In further embodiments, before the etch, a masking layer (not shown) may be formed covering the first ILD structure 122a and the sidewall spacer 502, while leaving the sacrificial gate 1404 exposed. Thereafter, the etch is performed with the masking layer in place, thereby selectively removing the sacrificial gate 1404. Subsequently, the masking layer may be stripped away.

Figure 17:
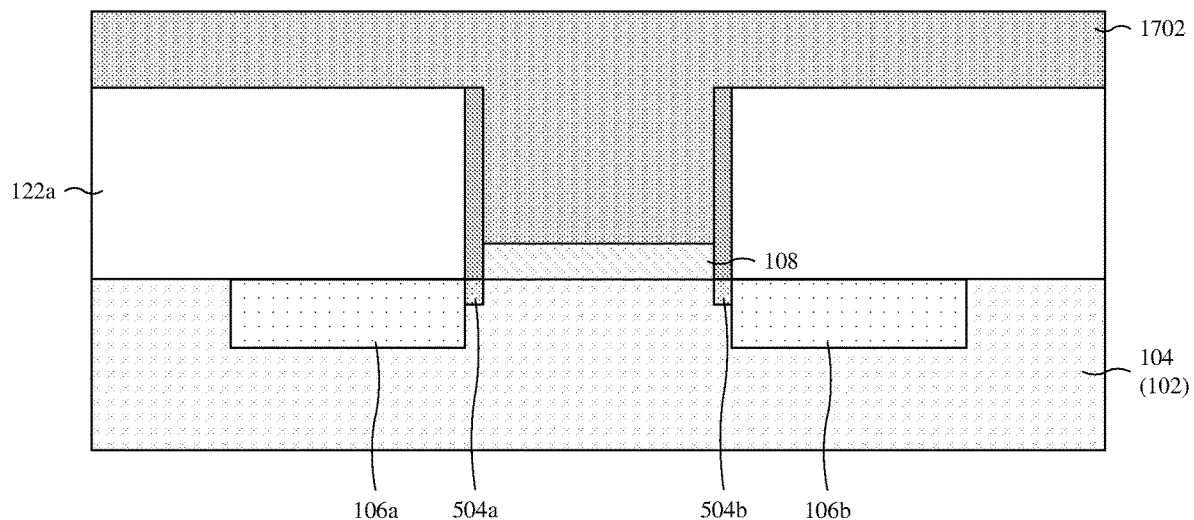

As shown in FIG. 17, a gate electrode layer 1702 is formed filling the opening 1602 (see FIG. 16) and over the first ILD structure 122a. The gate electrode layer 1702 is conductive and may comprise, for example, a metal W, Al, Ti, Mo, TiN, TaN, or the like. In some embodiments, the gate electrode layer 1702 may be formed by CVD, PVD, ALD, sputtering, electrochemical plating, electroless plating, or some other deposition process. The process of removing the sacrificial gate 1404 and replacing with the gate electrode layer 1702 as described above may be referred to as a replacement gate process or a gate-last high-k/metal gate (HKMG) process. The gate dielectric 108 may comprise a stack of dielectrics and may be partially removed or replaced by one or more other dielectric layers such as high-k dielectric materials.

It will be appreciated that, in some embodiments, the memory device gate stack 120 may be formed by other processes. For example, the memory device gate stack 120 may be formed by a gate-first HKMG process (e.g., the metal gate electrode is formed prior to source/drain formation), a fully silicided (FUSI) metal gate process (e.g., fully siliciding a polysilicon gate), or a doped polysilicon gate process (e.g., self-aligned polysilicon gate process). Depending on the process in which the memory device gate stack 120 is formed, the processing layer may comprise, for example, doped polysilicon (e.g., n-type/p-type polysilicon), undoped polysilicon, a metal (e.g., W, Al, Ti, Mo, or the like), a metal-nitride (e.g., TiN, TaN, or the like), some other conductive material, or a combination of the foregoing.

Figure 18:
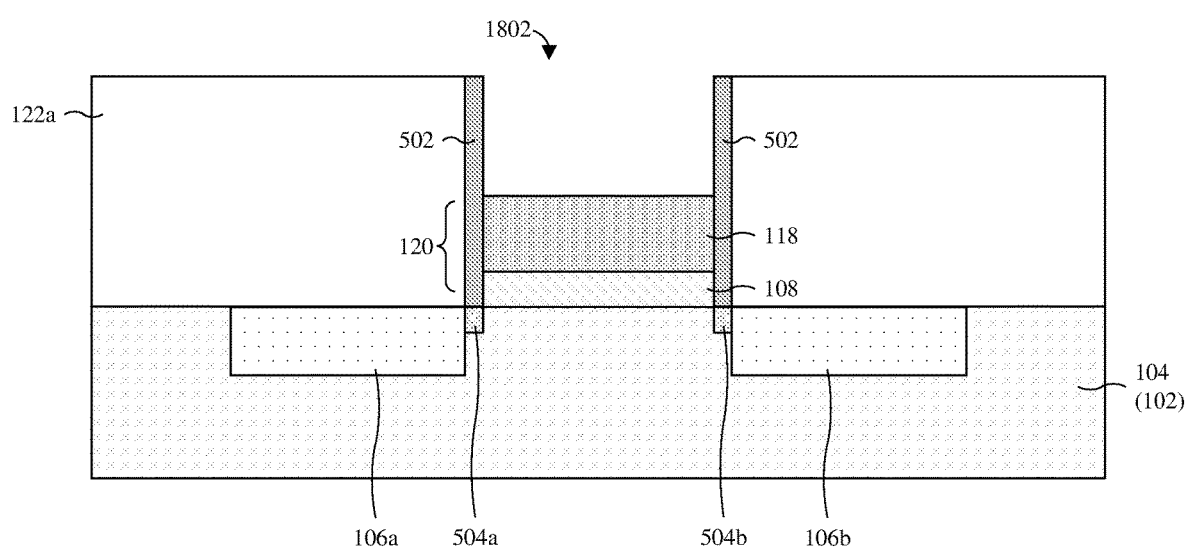

As shown in FIG. 18, the gate electrode layer 1702 (see FIG. 17) is etched back to be below a top surface of the sidewall spacer 502 and the first ILD structure 122*a* to form a gate electrode 118. In some embodiments, a planarization process (e.g., CMP) is firstly applied into the gate electrode layer 1702 (see FIG. 17) followed by an etching back process to further lower a height of the gate electrode layer 1702 (see FIG. 17) and form a recessed space 1802 between upper portions of the sidewall spacer 502.

Figure 19:
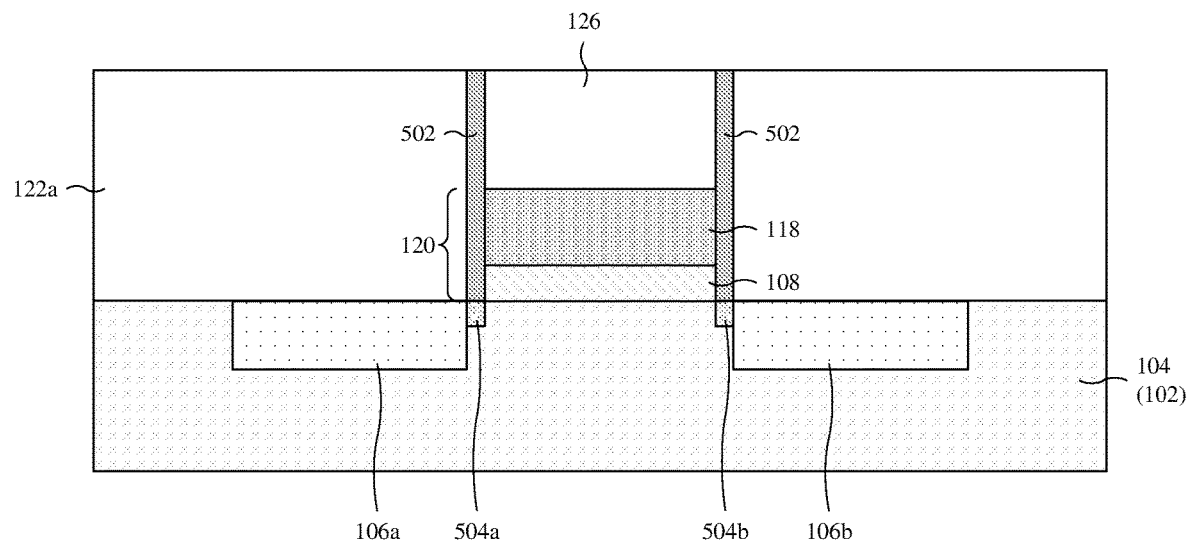

As shown in FIG. 19, a first self-aligned contact (SAC) mask 126 is filled in the recessed space 1802 (see FIG. 18). The first SAC mask 126 may be formed by depositing a masking layer in the recessed space 1802 (see FIG. 18) followed by a planarization process (e.g., CMP). The masking layer may comprise silicon nitride, Zirconium dioxide, or pure silicon.

Figure 20:
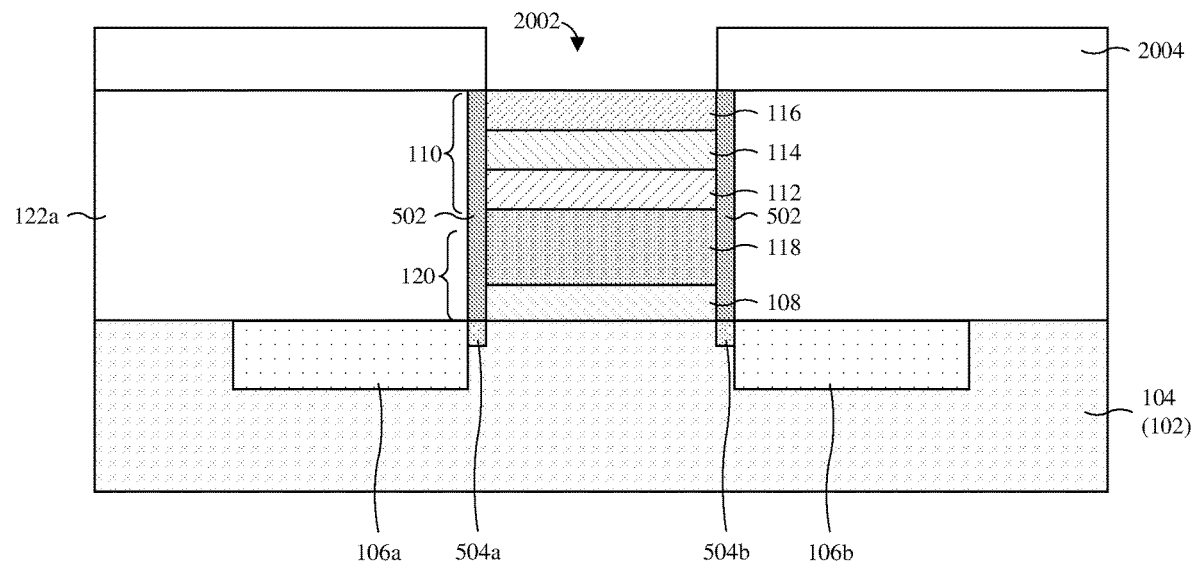

As shown in FIG. 20, a polarization switching structure 110 is formed filling an opening 2002 through the first SAC mask 126 and on the recessed gate electrode 118. A masking layer 2004 is firstly formed and patterned on the first ILD structure 122*a* to define the opening 2002. In some embodiments, the opening 2002 may extend in length direction of a device channel to edges of the first SAC mask 126 such that an upper portion of the sidewall spacer 502 is exposed. The opening 2002 may have a predetermined dimension based on a desired ratio of a ferroelectric effective area to a MOS area (defined as lateral dimensions of the gate electrode 118). The opening 2002 is then filled with layers of the polarization switching structure 110. The filling process of the polarization switching structure 110 may vary. For example, the polarization switching structure 110 may have varied embodiments as shown in FIGS. 4-10. As an example, a process for forming a first conductive structure 112 comprises depositing or growing the first conductive structure 112 on the gate electrode 118 followed by an etching back process. In some embodiments, the first conductive structure 112 may comprise, for example, a metal (e.g., Al, Ti, Ta, Au, Pt, W, Ni, Ir, etc.), a metal-nitride (e.g., TiN, TaN, etc.), a metal-oxide (e.g., IrO$_2$), doped polysilicon (e.g., n-type/p-type polysilicon), or the like. In yet further embodiments, the first conductive structure 112 may be deposited or grown by CVD, PVD, ALD, epitaxy, sol-gel, sputtering, electrochemical plating, electroless plating, or some other deposition or growth process.

A process for forming a ferroelectric structure 114 may comprise depositing or growing the ferroelectric structure 114 on the first conductive structure 112 followed by an etching back process to lower a height of the ferroelectric structure 114. In further embodiments, the ferroelectric structure 114 may comprise, for example, a metal-oxide (e.g., Hf$_X$O$_Y$), a component-metal-oxide (e.g., Hf$_X$Si$_Y$O$_Z$, Hf$_X$Al$_Y$O$_Z$, Hf$_X$Gd$_Y$O$_Z$, Hf$_X$Zr$_Y$O$_Z$, Hf$_X$La$_Y$O$_Z$, Hf$_X$Sr$_Y$O$_Z$, Hf$_X$Y$_Y$O$_Z$, STO, etc.), a metal-oxynitride (e.g., Hf$_X$O$_Y$N$_Z$), or the like. In yet further embodiments, the ferroelectric structure 114 may be deposited or grown by CVD, PVD, ALD, epitaxy, sol-gel, sputtering, electrochemical plating, electroless plating, or some other deposition or growth process.

A process for forming a second conductive structure 116 may comprise depositing or growing the second conductive structure 116 on the ferroelectric structure 114 followed by a planarization process. In further embodiments, the second conductive structure 116 may comprise, for example, a metal (e.g., Al, Ti, Ta, Au, Pt, W, Ni, Ir, etc.), a metal-nitride (e.g., TiN, TaN, etc.), a metal-oxide (e.g., IrO$_2$), doped polysilicon (e.g., n-type/p-type polysilicon), or the like. In yet further embodiments, the second conductive structure 116 may be deposited or grown by CVD, PVD, ALD, epitaxy, sol-gel, sputtering, electrochemical plating, electroless plating, or some other deposition or growth process. The planarization process can be a chemical-mechanical polishing process.

In some alternative embodiments, the first conductive structure 112 is formed conformally on the gate electrode 118 and extending upwardly along sidewalls of the opening 2002 as a U-shape, similarly as shown in FIG. 6. The ferroelectric structure 114 may be formed on the first conductive structure 112. The ferroelectric structure 114 may also be formed conformally and extending upwardly along sidewalls of the first conductive structure 112 as a U-shape, similarly as shown in FIG. 5, 6, or 9. The second conductive structure 116 is then formed on the ferroelectric structure 114. Subsequently, the masking layer 2004 is removed, and a planarization process can be performed to achieve a planar top surface of the polarization switching structure 110 that is coplanar with that of the first ILD structure 122*a*.

In some embodiments, the first conductive structure 112 is formed as a conformal layer having a thickness between about 3 nm and about 15 nm. The ferroelectric structure 114 may be formed as a conformal layer having a thickness between about 3 nm and about 20 nm. In further embodiments, the second conductive structure 116 is formed as a conformal layer having a thickness between about 3 nm and about 15 nm. A combined thickness of the first conductive structure 112, the ferroelectric structure 114, and the second conductive structure 116 may be between about 10 nm and about 50 nm. Though the first conductive structure 112, the ferroelectric structure 114, and the second conductive structure 116 are described herein, the polarization switching structure 110 can be formed by more or fewer layers based on varied embodiments illustrated above.

Figure 21:
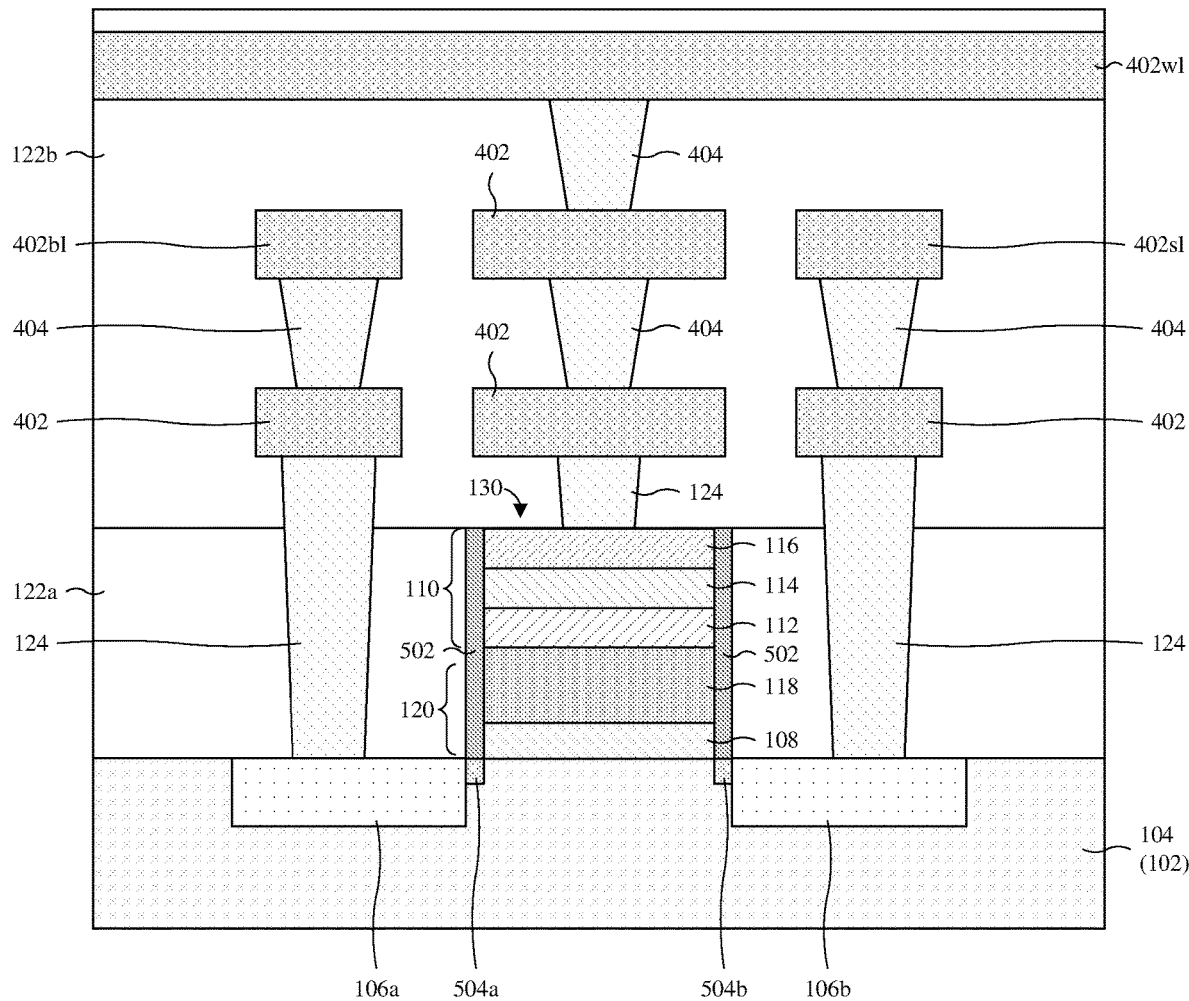

As shown in FIG. 21, a second ILD structure 122*b*, a plurality of conductive contacts 124, a plurality of conductive lines 402, and a plurality of conductive vias 404 are formed over the first ILD structure 122*a* and the FeFET stack 130. The second ILD structure 122*b* may be formed with a substantially planar upper surface. In some embodiments, a process for forming the second ILD structure 122*b* comprises depositing a plurality of ILD layers, which are stacked on one another, over the first ILD structure 122*a* and the FeFET stack 130. The ILD layers may be deposited by CVD, PVD, sputtering, or some other deposition process. In further embodiments, a planarization process (e.g., CMP) may be performed on one or more of the plurality of ILD layers.

In some embodiments, a process for forming the plurality of conductive contacts 124 comprises forming a first ILD layer on the first ILD structure 122a, the sidewall spacer 502, and the polarization switching structure 110. Thereafter, the first ILD layer and the first ILD structure 122a are selectively etched to form contact openings (not shown) that correspond to the plurality of conductive contacts 124. A conductive material (e.g., W) is then deposited on the first ILD layer and filling the contacts opening. Subsequently, a planarization process (e.g., CMP) is performed into the conductive material and the first ILD layer, thereby forming the plurality of conductive contacts 124 extending through the first ILD structure 122a. In further embodiments, the conductive material may be deposited by CVD, PVD, ALD, sputtering, electrochemical plating, electroless plating, or some other deposition process.

In some embodiments, a process for forming the plurality of conductive lines 402 and the plurality of conductive vias 404 comprises forming a second ILD layer over the plurality of conductive contacts 124 and the first ILD layer. The second ILD layer is selectively etched to form a first set of conductive line openings (not shown) that correspond to a first set of conductive lines of the plurality of conductive lines 402. A conductive material (e.g., Cu) is deposited on the second ILD layer and filling the first set of conductive line openings. A planarization process (e.g., CMP) is performed into the conductive material and the second ILD layer, thereby forming the first set of conductive lines.

Thereafter, a third ILD layer is formed over the first set of conductive lines and the second ILD layer. The third ILD layer is selectively etched to form a first set of conductive via openings (not shown) that correspond to a first set of conductive vias of the plurality of conductive vias 404. A conductive material (e.g., Cu) is deposited on the third ILD layer and filling the first set of conductive via openings. A planarization process (e.g., CMP) is performed into the conductive material and the third ILD layer, thereby forming the first set of conductive vias. This process (e.g., alternating formation of conductive lines and vias) is repeated until the plurality of conductive lines 402 and the plurality of conductive vias 404 are formed.

The plurality of conductive lines 402, the plurality of conductive vias 404, and the plurality of conductive contacts 124 are electrically coupled together in a predefined manner and configured to provide electrical connections between various devices disposed throughout the ferroelectric FinFET memory device. The plurality of conductive lines 402, the plurality of conductive vias 404, the plurality of conductive contacts 124, and the ILD structure 122 may be referred to as an interconnect structure. A first one of the plurality of conductive lines 402 is denoted as 402w1 and may be referred to as a word line. The word line may be electrically coupled to the polarization switching structure 110 via the interconnect structure and the gate electrode 118. A second one of the plurality of conductive lines 402 is denoted as 402b1 and may be referred to as a bit line. The bit line may be electrically coupled to a first source/drain region 106a of the source/drain regions 106a-b via the interconnect structure. A third one of the plurality of conductive lines 402 is denoted as 402s1 and may be referred to as a source line. The source line may be electrically coupled to a second source/drain region 106b of the source/drain regions 106a-b via the interconnect structure.

Figure 22:
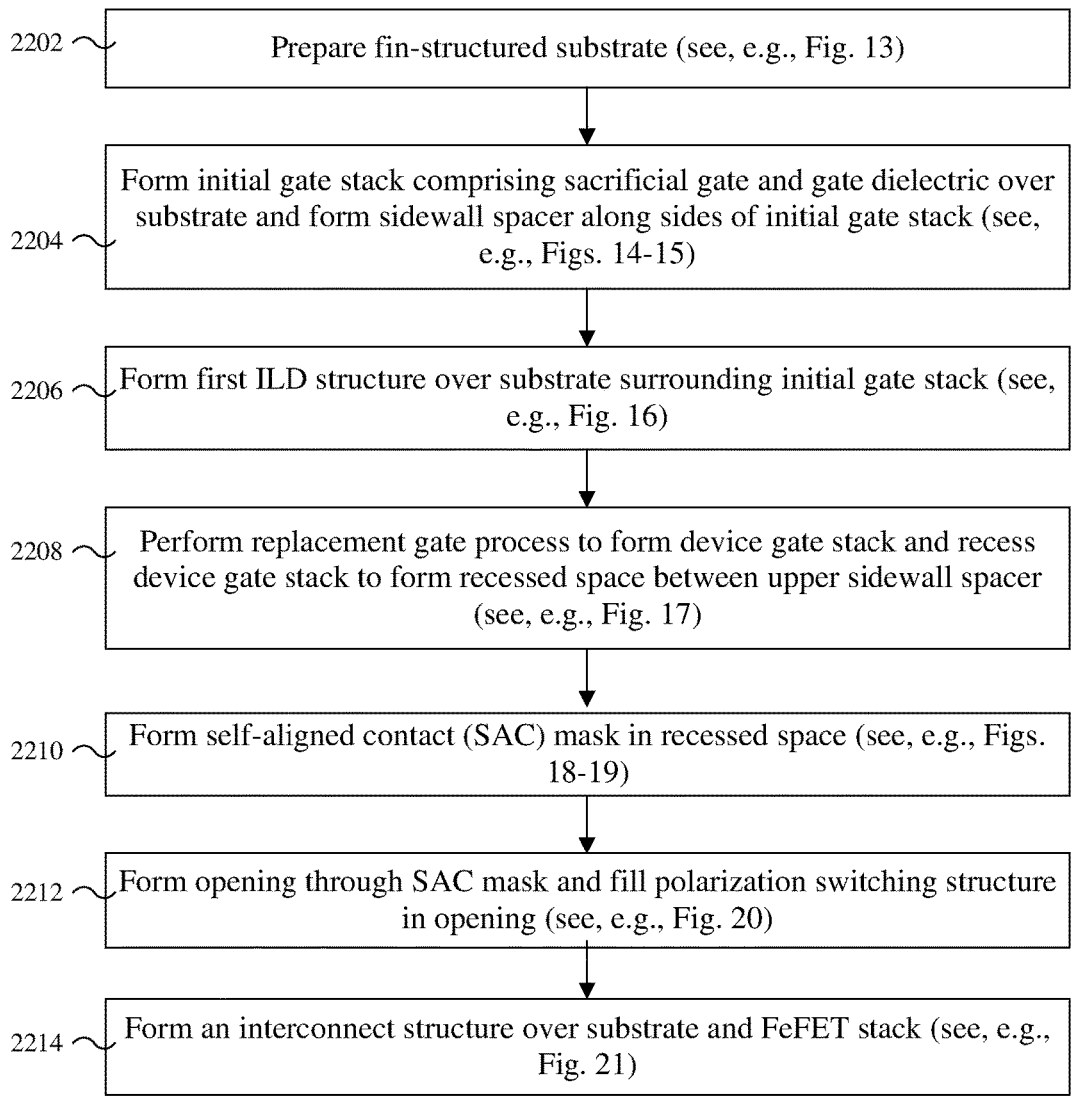
FIG. 22 illustrates a flowchart of some embodiments of a method for forming a ferroelectric FinFET memory device.

FIG. 22 illustrates a flowchart 2200 of some embodiments of a method for forming an integrated chip (IC) comprising a ferroelectric memory device. The ferroelectric memory device may be the ferroelectric FinFET memory device 100. While the flowchart 2200 of FIG. 22 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2202, a fin-structured substrate is prepared. FIG. 13 illustrates a cross-sectional view of some embodiments corresponding to act 2202.

At act 2204, an initial gate stack is formed comprising a sacrificial gate and a gate dielectric over the substrate. A sidewall spacer is formed over the substrate and along sides of the initial gate stack. Then, source/drain regions are formed in the substrate on opposite sides of the sidewall spacer. In some embodiments, lightly-doped source/drain extensions are formed in the substrate and on opposite sides of the initial gate stack before forming the source/drain regions. FIGS. 14-15 illustrate a series of cross-sectional views of some embodiments corresponding to act 2204.

At act 2206, a first interlayer dielectric (ILD) structure is formed over the substrate and the initial gate stack. The first ILD structure may be then polished to have a top surface coplanar with that of the initial gate stack. FIG. 16 illustrates a cross-sectional view of some embodiments corresponding to act 2206.

At act 2208, a replacement gate process is performed to form a device gate stack. The sacrificial gate is removed, followed by filling dielectric materials and metal materials to form the device gate stack. FIG. 17 illustrates a cross-sectional view of some embodiments corresponding to act 2208.

At act 2210, a self-aligned contact (SAC) mask is formed in the recessed space. The device gate stack is firstly recessed to form a recessed space between upper sidewall spacer. The SAC mask may be then formed by depositing a masking material in the recessed space followed by a planarization process to have a top surface coplanar with the sidewall spacer and/or the first ILD structure. FIGS. 18-19 illustrate a series of cross-sectional views of some embodiments corresponding to act 2210.

At act 2212, an opening is formed through the SAC mask, and a polarization switching structure is formed in opening and thus forming a FeFET stack. The polarization switching structure may comprise a ferroelectric structure between a first conductive structure and a second conductive structure. The polarization switching structure can also be other applicable structures such as embodiments shown by FIGS. 4-10 above. FIG. 20 illustrates a cross-sectional view of some embodiments corresponding to act 2212.

At act 2214, an interconnect structure is formed over the substrate and the FeFET stack. FIG. 21 illustrates a cross-sectional view of some embodiments corresponding to act 2214.

In some embodiments, the present application provides a method of forming a ferroelectric memory device. In the method, a pair of source/drain regions is formed in a substrate. A gate dielectric and a gate electrode are formed over the substrate and between the pair of source/drain regions. A polarization switching structure is formed directly on a top surface of the gate electrode.

In some further embodiments, the present application provides a method of forming an integrated chip (IC). The method comprises providing a substrate of a logic region and a memory region and forming a logic device gate stack over the substrate in the logic region. The method further comprises forming a memory device gate stack over the substrate in the memory region and forming a first self-aligned contact (SAC) mask on the logic device gate stack and the memory device gate stack. The method further comprises forming a polarization switching structure on the memory device gate stack and surrounded by the first SAC mask.

In some additional embodiments, the present application provides a method for forming a ferroelectric memory device. The method comprises forming an initial gate stack comprising a gate dielectric over a substrate and a sacrificial gate over the gate dielectric. A sidewall spacer is formed over the substrate and along sides of the initial gate stack. The sacrificial gate is removed and replaced by a metal gate. The metal gate is recessed to form a recessed space between an upper portions of the sidewall spacer. A self-aligned contact (SAC) mask is formed in the recessed space. An opening is formed through the SAC mask that exposing the metal gate and filled with a polarization switching structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric memory device, comprising:
  a pair of source/drain regions disposed in a substrate;
  a gate dielectric disposed over the substrate and between the pair of source/drain regions;
  a gate electrode disposed on the gate dielectric;
  a polarization switching structure disposed over the gate electrode with a lateral dimension smaller than that of the gate electrode; and
  a pair of sidewall spacers disposed over the substrate and along opposite sidewalls of the gate electrode and the polarization switching structure.

2. The ferroelectric memory device of claim 1, wherein the substrate comprises an upper portion including a plurality of fin structures.

3. The ferroelectric memory device of claim 1, further comprising a first self-aligned contact mask disposed on an upper surface of the gate electrode surrounding a periphery of the polarization switching structure.

4. The ferroelectric memory device of claim 3, wherein the first self-aligned contact mask has a top surface aligned with that of the pair of sidewall spacers.

5. The ferroelectric memory device of claim 3, further comprising a second self-aligned contact mask disposed on the polarization switching structure and having a top surface aligned with that of the first self-aligned contact mask.

6. The ferroelectric memory device of claim 1, wherein the polarization switching structure is in direct contact with the pair of sidewall spacers.

7. The ferroelectric memory device of claim 1, wherein the polarization switching structure comprises:
  a ferroelectric structure disposed over the gate electrode; and
  a conductive structure disposed on the ferroelectric structure.

8. The ferroelectric memory device of claim 7, wherein the ferroelectric structure and the conductive structure respectively has a planar shape.

9. The ferroelectric memory device of claim 7, wherein the ferroelectric structure has a U-shape including a bottom planar portion and an upper vertical portion, the upper vertical portion contacting the sidewall spacers.

10. The ferroelectric memory device of claim 7, wherein the ferroelectric structure and the conductive structure have top surfaces coplanar with one another.

11. The ferroelectric memory device of claim 7,
  wherein the conductive structure has a thickness between about 3 nanometers (nm) and about 15 nm, and
  wherein the ferroelectric structure has a thickness between about 5 nm and about 30 nm.

12. The ferroelectric memory device of claim 7, wherein the ferroelectric structure has a U-shape and a top surface coplanar with that of the conductive structure.

13. The ferroelectric memory device of claim 1, further comprising an interfacial dielectric layer disposed on the substrate under the gate dielectric.

14. An integrated chip (IC), comprising:
  a logic region and a memory region integrated in a substrate;
  a logic device disposed in the logic region and comprising a logic device gate stack disposed over the substrate;
  a ferroelectric FinFET memory device in the memory region and comprising a memory device gate stack disposed over the substrate and a polarization switching structure disposed on an upper surface of the memory device gate stack; and
  a first self-aligned contact (SAC) mask disposed on the memory device gate stack and having a top surface coplanar with that of the polarization switching structure.

15. The IC of claim 14, wherein the polarization switching structure has a top surface coplanar with that of the first SAC mask.

16. The IC of claim 14, further comprising a sidewall spacer disposed along sidewalls of the memory device gate stack, the polarization switching structure, and the first SAC mask.

17. The IC of claim 16, wherein the polarization switching structure is in direct contact with the first SAC mask and the sidewall spacer.

18. The IC of claim 16, further comprising:
  a first interlayer dielectric (ILD) structure disposed over the substrate surrounding the logic device gate stack and the memory device gate stack;
  a first conductive via disposed in the first ILD structure and reaching on the polarization switching structure of the ferroelectric FinFET memory device; and
  a second conductive via disposed in the first ILD structure and a second SAC mask reaching on the logic device gate stack of the logic device.

19. A ferroelectric FinFET memory device, comprising:
  a gate stack comprising a gate dielectric over a substrate and a metal gate over the gate dielectric;

a sidewall spacer disposed over the substrate and along sides of the gate stack;

a self-aligned contact (SAC) mask disposed over the metal gate between upper portions of the sidewall spacer; and a polarization switching structure disposed on the metal gate and within an opening of the SAC mask.

20. The ferroelectric FinFET memory device of claim 19, wherein the SAC mask surrounds and directly contacts a periphery of the polarization switching structure.

* * * * *